US00RE38734E

(19) United States
(12) Reissued Patent
Kurachi et al.

(10) Patent Number: US RE38,734 E
(45) Date of Reissued Patent: May 17, 2005

(54) SEMICONDUCTOR SWITCHING APPARATUS AND METHOD OF CONTROLLING A SEMICONDUCTOR SWITCHING ELEMENT

(75) Inventors: Kazuhiro Kurachi, Fukuoka (JP); Masanori Yamamoto, Tokyo (JP)

(73) Assignee: Mitsubishi Denki Kabushiki Kaisha, Tokyo (JP)

(21) Appl. No.: 10/259,859

(22) Filed: Sep. 30, 2002

Related U.S. Patent Documents

Reissue of:
(64) Patent No.: 5,777,506
Issued: Jul. 7, 1998
Appl. No.: 08/700,874
Filed: Aug. 21, 1996

(30) Foreign Application Priority Data

Jan. 17, 1996 (JP) ..... 8-006145

(51) Int. Cl.[7] ..... H03K 17/72
(52) U.S. Cl. ..... 327/440; 327/438; 327/582
(58) Field of Search ..... 327/438, 440, 327/442, 445, 446, 453, 455, 468, 469, 476, 582

(56) References Cited

U.S. PATENT DOCUMENTS 5,237,225 A * 8/1993 Gruning ..... 327/440
5,493,247 A * 2/1996 Gruning ..... 327/440

OTHER PUBLICATIONS

Conference Record of the 1986 IEEE Industry Applications Society Annual Meeting Part I Papers Presented at the Twenty–First Annual Meeting, Radisson Hotel, Denver, CO Sep. 28–Oct. 3, Sponsored by the IEEE Industry Applications Society.

* cited by examiner

*Primary Examiner*—Jeffrey Zweizig
(74) *Attorney, Agent, or Firm*—Oblon, Spivak, McClelland, Maier & Neustadt, P.C.

(57) ABSTRACT

An inductance in a path (R1) from a gate electrode (3G) of a GTO (3) through a gate driver (4) and a node (13) to a cathode electrode (3K) is determined so that a turn-off gain may be not more than 1. At a turn-off, a main current ($I_A$) is entirely commutated from the gate electrode (3G) towards the node (13) through the gate driver (4) in a direction reverse to a turn-off control current ($I_G$) A peak voltage suppressing circuit (5) clamps an anode-cathode voltage ($V_{A-K}$) which rises on, to a prescribed voltage value for a prescribed time. This prevents losses caused by a snubber circuit. Commutation of a main current to the gate prevents locally concentrating in the cathode side of the semiconductor switching element, to thereby increase the turn off capability of the semiconductor switching element. Further, this prevents or reduces dissipation of large amount produced by a discharge of the electric charges from a snubber capacitor. Thus, reduction in dissipation and in size of the whole apparatus can be achieved.

18 Claims, 17 Drawing Sheets

10

10

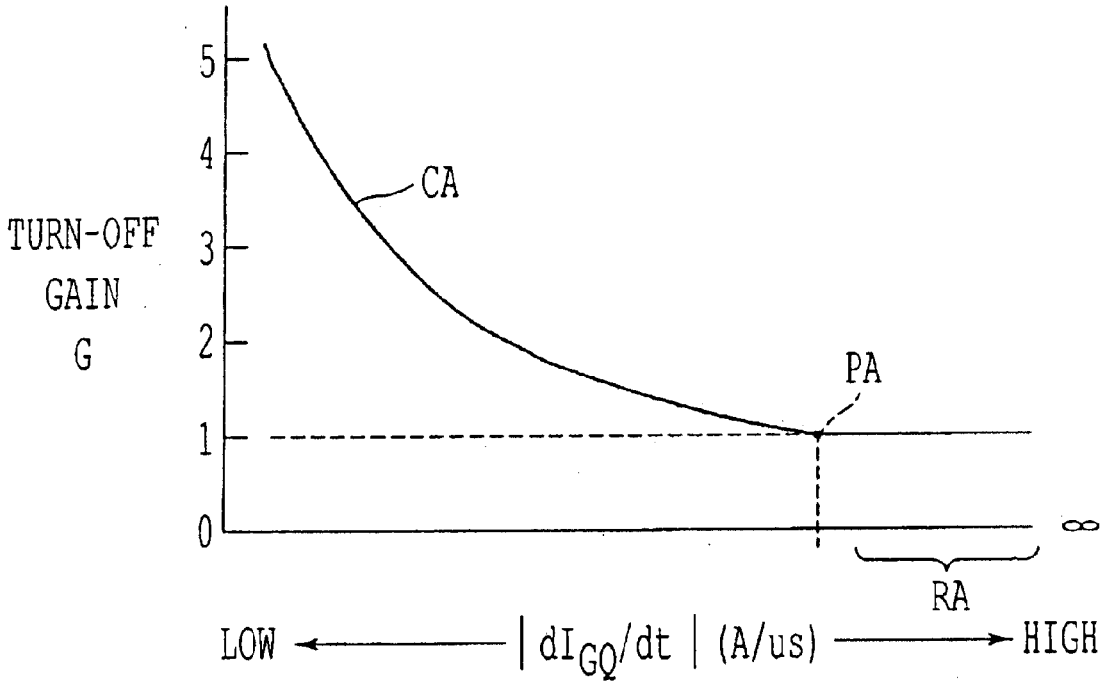
*FIG. 11*
(AMENDED)

(AMENDED)

SEMICONDUCTOR SWITCHING APPARATUS AND METHOD OF CONTROLLING A SEMICONDUCTOR SWITCHING ELEMENT

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a semiconductor switching apparatus used for e.g., a power converter, and to a method of controlling a semiconductor switching element.

2. Description of the Background Art

FIG. 16 is a diagram showing an example of a circuit configuration of a prior-art semiconductor switching apparatus. In FIG. 16, a semiconductor switching apparatus is given reference character 3P, which is herein a GTO (Gate Turn-off Thyristor). A gate driver 4P connected between the gate and cathode of GTO 3P produces a gate turn-on control current $I_{GP}$ and applies the current $I_{GP}$ to the gate of GTO 3P to turn the GTO 3P on. Further, the driver 4P conducts a gate reverse current $I_{GQP}$ whose rate of rise of current ($dI_{DQP}/dt$) is in a range of 20 to 50 A/μs from the gate to the cathode of GTO 3P. The gate reverse current $I_{gqp}$ is separated from the anode current $I_{AP}$. At this time, a turn-off gain ranges from 2 to 5, and the GTO 3P is turned off.

To suppress the rate of rise of voltage ($dV_{AKP}/dt$) and peak value of the anode-cathode voltage $V_{AKP}$, a snubber circuit is generally used. The snubber circuit herein has a configuration where a snubber capacitor $C_S$ and a snubber diode $D_S$ are connected in parallel to the GTO 3P, and a snubber resistor $R_S$ is connected in parallel to the snubber diode $D_S$ in order to discharge the electric charges accumulated in the snubber capacitor $C_S$ at a turn-off.

An inductance 1P suppresses the rate of rise of anode current ($dI_{AP}/dt$) which flows when the GTO 3P is turned on to not more than 1000 A/μs, and a circulating diode 2P connected in parallel to the inductance 1P circulates energy generated in the inductance 1P when the GTO 3P is turned off.

Furthermore, an inductance $L_S$ is a total inductance of the snubber circuit.

FIG. 17 shows observed waveforms in a turn-off test of the circuits in semiconductor switching apparatus. In FIG. 17, the waveforms C1P, C2P and C3P represent the anode current $I_{AP}$, the anode-cathode voltage $V_{AKP}$ and the gate reverse current $I_{GQP}$, respectively, and the horizontal axis indicates time.

In FIG. 17, at time tP1, the GTO 3P is in a turn-off state, and the gate reverse current $I_{GQP}$ is 0. At this time, the gate reverse current $I_{GQP}$ is increased, with the the rate of rise of the gate reverse current ($dI_{GQP}/dt$) ranging from 20 to 50 A/μs. When the gate reverse current reaches the peak value, the anode current $I_{AP}$ starts falling and the anode-cathode voltage $V_{AKP}$ of the GTO 3P starts rising. At the same time, a current $I_S$ starts flowing towards the above-discussed snubber circuit side, and a voltage is developed by the rate of rise of the current Is and the inductance $L_S$ in the snubber circuit (snubber inductance) and the capacitor's charge voltage by the current $I_S$, and is then superimposed on the anode-cathode voltage $V_{AKP}$ to generate a spike voltage $V_{DSP}$ at time tP3. The spike voltage $V_{DSP}$ is likely to cause a dissipation. For example, a current flow of about 4000 A brings the dissipation of as much as several MW. Therefore, it is required to suppress the spike voltage $V_{DSP}$ to as low as possible and continued efforts to reduce the snubber inductance $L_S$ have been made.

The rate of rise of the anode-cathode voltage ($dV_{AKP}/dt$) constantly changes after the spike voltage $V_{DSP}$ is generated. The anode current $I_{AP}$ continues to flow after time dP3 and this is referred to as a "tail current". The tail current reaches the maximum at time tP4. The tail current and the anode-cathode voltage $V_{AKP}$ produce further power dissipation. The anode-cathode voltage $V_{AKP}$ reaches a peak voltage at time tP5. After that, the anode-cathode voltage $V_{AKP}$ reaches a power voltage (or main line voltage) $V_{DD}$.

To suppress the rate of rise of voltage ($dV_{AKP}/dt$), the above-discussed snubber capacitor $C_S$ is required. The snubber capacitor $C_S$ has a capacitance value $I_{AP}/(dV_{AKP}/dt)$ which is generally selected so as to satisfy the relation $dV_{AKP}/dt \leqq f$ 1000 V/μs (the $dV_{AKP}/dt$ is calculated by the following equation: $dV_{AKP}/dt \approx I_{AP}/CS$).

FIGS. 18 and 19 illustrate a configuration of the background-art GTO 3P (consisting of a GTO element package and two stacked electrodes) used in the semiconductor switching apparatus of FIG. 16, inclusive of the gate driver 4P. FIG. 18 is a side view of the GTP 3P viewed from the direction of the arrow DP2 of FIG. 19, and partly a sectional view. FIG. 19 is a plan view of the GTO 3P exclusive of a stacked electrode 27Pa viewed from the direction of the arrow DP1 of FIG. 18.

FIGS., 18 and 19 show a GTO element (or GTO device) 20P, an internal inductance 4PL of the gate driver 4P, an external gate lead (gate drawing line) 21P and an external cathode lead (cathode drawing line) 22P both of which are formed of coaxial shield leads or twisted lead lines. A gate terminal 25P of the GTO element 20P and an end of the external gate lead 21P are joined to a metal joining member (or terminal) 23P by soldering to be fixed with each other. Similarly, a cathode terminal 26P of the GTO element 20P and an end of the external cathode lead 22P are joined to a metal joining member 24P by soldering to be fixed with each other. Thus, both the terminals 25P and 26P are connected to the gate driver 4P through the leads 21P and 22P, respectively.

Stacked electrodes 27Pa and 27Pb apply pressure onto the GTO element 20P.

A semiconductor substrate (or wafer) 28P is provided with segments of the GTO, a gate electrode 29Pa made of Al (Aluminum) is formed on an outermost peripheral portion of an upper surface of the semiconductor substrate 28P, and a cathode electrode 29Pb is formed inside the gate electrode 29Pa on the upper surface, correspondingly to the segment. A cathode strain relieving plate (or metal plate) 30P and a cathode post electrode 31P are stacked in this order on an upper surface of the cathode electrode 29Pb provided on the upper surface of the semiconductor substrate 28P. An anode strain relieving plate 32P and an anode post electrode 33P are stacked in this order on a surface of an anode electrode (not shown) provided on a bottom surface of the semiconductor substrate 28P (opposite to the cathode electrode 29Pb).

A ring-shaped gate electrode 34P is in contact with an upper surface of the gate electrode 29Pa on the semiconductor substrate 28P, and a belleville spring 35P pushes the ring-shaped gate electrode 34P against the gate electrode 29Pa through an annular insulator 36P. An insulating sheet 37P is provided to isolate the ring-shaped gate electrode 34P from the cathode strain relieving plate 30P and the post electrode 31P. A gate lead 38P has one end which is fitted into the ring-shaped gate electrode 34P by brazing or welding and the other end which is electrically connected to the gate terminal 25P. A first flange 39P has one end which is fitted into the cathode post electrode 31P and the other end which serves as a cathode terminal 26P, and a second flange 40P has one end which is fitted into the anode post electrode 33P. An insulating tube (or ceramic) 41P has an opening whose internal surface is provided with the gate terminal 25P, and a projection 42P. End portions 43Pa and 43Pb of the insulating tube 41P are protruded through its upper and lower surfaces to be fitted airtightly to the first and second flanges 39P and 40P respectively, thereby ensuring a closed structure of the GTO element 20P.

The above-discussed background-art semiconductor switching apparatus has the following two problems.

(1) As shown in FIG. 19, the external gate lead 21P which draws the gate reverse current is taken out from a localized portion inside the ring-shaped gate electrode 34P. Accordingly, only one-way drawing of the gate reverse current is made. As a result, when the GTO is turned off, with nonuniform cathode current, the loss produced by the spike voltage and the tail current, i.e., dissipation, is locally concentrated on the cathode side surface inside the GTO, the GTO device is failed by a local rise of temperature, to fall into a conductive state. Thus, there arises a problem that failure of the turn-off occurs with high probability.

FIGS. 20 and 21 are a plan view and a sectional view of the GTO element, respectively, which schematically illustrate the above problem in the background art. FIG. 21 is a part of the sectional view taken along the line CSA-CSB of FIG. 20. Specifically discussing, the gate reverse current of the GTO segment formed on a region in the vicinity of the ring-shaped gate electrode 34P, such as a region REO, is drawn earlier than that of the GTO segment formed in a region REI, further inside the region REO within a cylindrical wafer, and therefore the GTO segment in the region REO are turned off earlier. In contrast, the GTO segment formed in the region REC of the wafer takes the longest turn-off time, and a cathode current $I_K$ flows towards the cathode electrodes of the GTO segments in the central region REC from the GTO segments in the regions around the region REC to cause a current crowding in a localized portion inside the wafer of the GTO.

(2) The second problem is caused by the snubber circuit, in particular, the snubber capacitor. Specifically discussing, the electric charges which are charged up in the snubber capacitor $C_S$ (see FIG. 16) at a turn-off have to be completely discharged until the next turn-off, and therefore the charges of the snubber capacitor are discharged through the snubber resistor $R_S$ when the GTO 3P is turned on, to thereby cause dissipation of large amount. At this time, the capacitance of power consumption in the snubber resistor $R_S$ is expressed as $PW=\frac{1}{2}\times C_S\times f(V_{DD}^2+(V_{DM}-V_{DD})^2)$, where $V_{DD}$ and $V_{DM}$ represent the power supply voltage and a voltage of the snubber capacitor $C_S$ which is charged up at the turn-off, respectively. For this reason, a cooling device is required for cooling the whole apparatus.

Thus, when the GTO 3P is connected to the snubber resistor which has the above capacitance of power consumption, the power generated by the snubber resistor is out of the power to be transmitted as a loss to degrade the efficiency, and further the necessity for the cooling device arises. That is a hindrance to simplification and size-reduction of the whole apparatus.

SUMMARY OF THE INVENTION

The present invention is directed to a semiconductor switching apparatus. According to a first aspect of the present invention, the semiconductor switching apparatus comprises: a semiconductor switching element having first, second and third electrodes, for carrying a main current which flows into the first electrode, from the first electrode direct to the second electrode when brought into an on-state in response to a turn-on control current applied to the third electrode; and driving control means connected between the third and second electrodes, for producing the turn-on control current and applying it to the third electrode, in which the main current is entirely commutated to the driving control means through the first to third electrodes in a direction reverse to the turn-on control current at a turn-off.

Preferably, a turn-off gain is determined not more than 1 at the turn-off, which is represented by the absolute value of the ratio of the main current to a current which flows in the direction reverse to the turn-on control current.

Preferably, an inductance existing in a path from the third electrode through the driving control means and the second electrode to the third electrode is determined a value required to obtain the turn-off gain of not more than 1.

In a second aspect of the present invention, a semiconductor switching apparatus comprises: a semiconductor switching element; and an interconnection path for transmitting a turn-on control current necessary to turn the semiconductor switching element on, in which the interconnection path is disposed so that a main current flowing into the semiconductor switching element in an on-state is entirely commutated to the interconnection path at a turn-off.

The present invention is also directed to a method of controlling a semiconductor switching element which has first, second and third electrodes. According to a third aspect of the present invention, the method comprises steps of: providing a driving circuit for generating a turn-on control current for turning on the semiconductor switching element; applying said turn-on control current to the third electrode to bring the semiconductor switching element into an on-state; and commutating a main current flowing into the first electrode entirely towards the second electrode through the driving circuit in a direction reverse to the turn-on control current to turn the semiconductor switching element off.

The first object of the present invention is to prevent the dissipation from locally concentrating on part of semiconductor switching elements within the semiconductor wafer. That avoids the failure of the device, to thereby enhance the reliability of the apparatus.

The second object of the present invention is to prevent or markedly suppress the dissipation caused by the snubber circuit in the background art. That ensures size-reduction, simplification, cost-reduction and high efficiency of the apparatus.

The third object of the present invention is to eliminate the necessity for a circuit to suppress a rise in the voltage between the first and second electrodes, such as a snubber circuit. That ensures size-reduction of the apparatus and high efficiency.

The fourth object of the present invention is to propose a new and practical turnoff method of the semiconductor switching element.

These and other objects, features, aspects and advantages of the present invention will become more apparent from the following detailed description of the present invention when taken in conjunction with the accompanying drawings.

BRIEF DESCRIPTION OF THE DRAWINGS

FIG. 11 shows a relation between the rate of rise of reverse gate current and the turn-off gain;

DESCRIPTION OF THE PREFERRED EMBODIMENTS

A semiconductor switching apparatus or a semiconductor switching element is applied for various types of power converters, such as a power converter on traction, an SVG (Static Var Generator) and an industrial power converter.

The point of the proposed new method of controlling the semiconductor switching element (or switching device) lies in that a main current flowing in the semiconductor switching element in an on-state is entirely commutated to a driving circuit, to thereby bring the semiconductor switching element into a turn-off state.

A gate turn-off thyristor (hereinafter referred to as "GTO") will be discussed as an example of the semiconductor switching element. In this case, the first, second and third electrodes of the GTO correspond to an anode electrode, a cathode electrode and a gate electrode, respectively. The semiconductor switching element is not limited to the GTO of a quadruple layered structure, but may be a transistor of a triple layered structure. In the case of a transistor, the first, second and third electrodes correspond to a collector electrode, an emitter electrode and a base electrode in an NPN transistor and correspond to an emitter electrode, a collector electrode and a base electrode in a PNP transistor.

<The First Preferred Embodiment>

Figure 1:
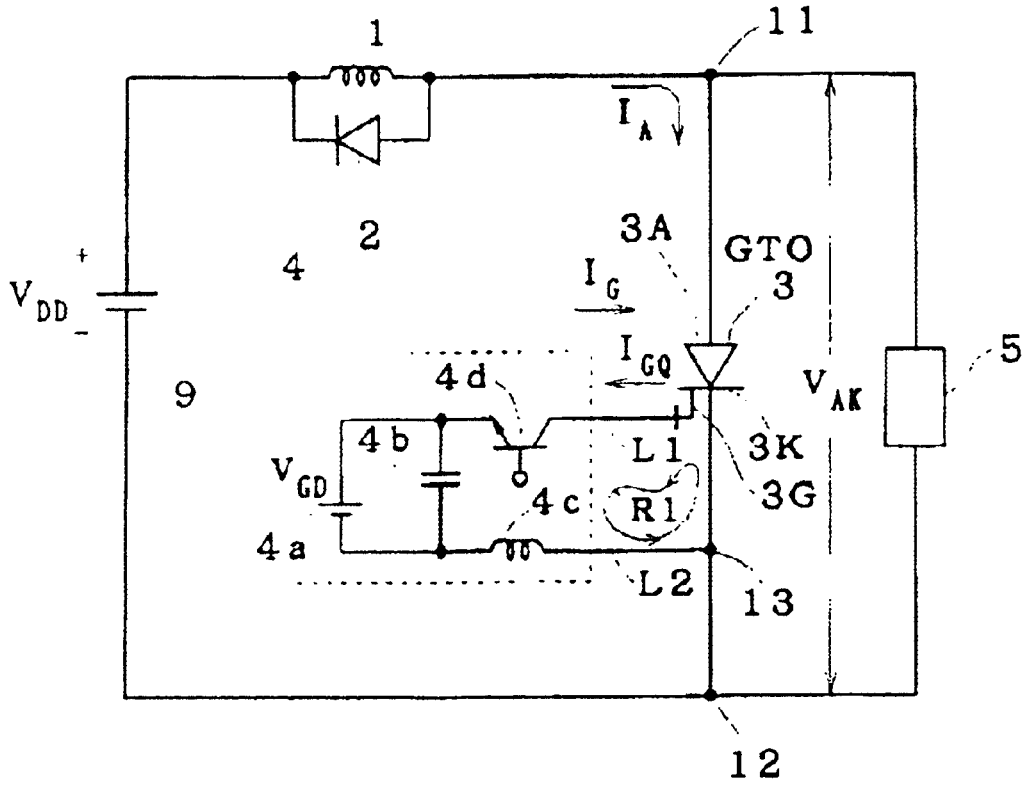
FIG. 1 is a circuit diagram of a semiconductor switching apparatus in accordance with a first preferred embodiment of the present invention.
Figure 2:
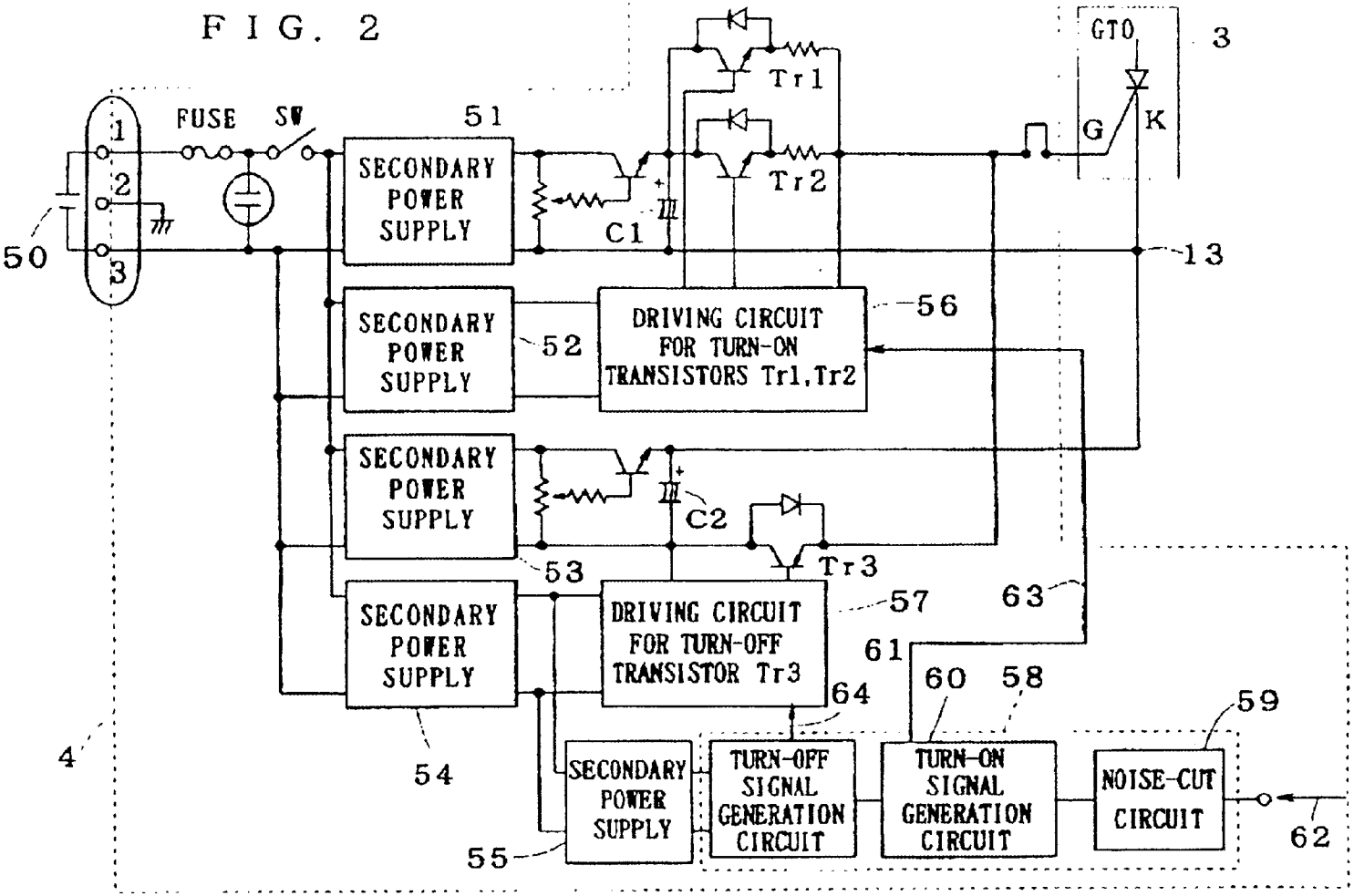
FIG. 2 is a diagram showing a specific configuration of a gate driver circuit.
Figure 3:
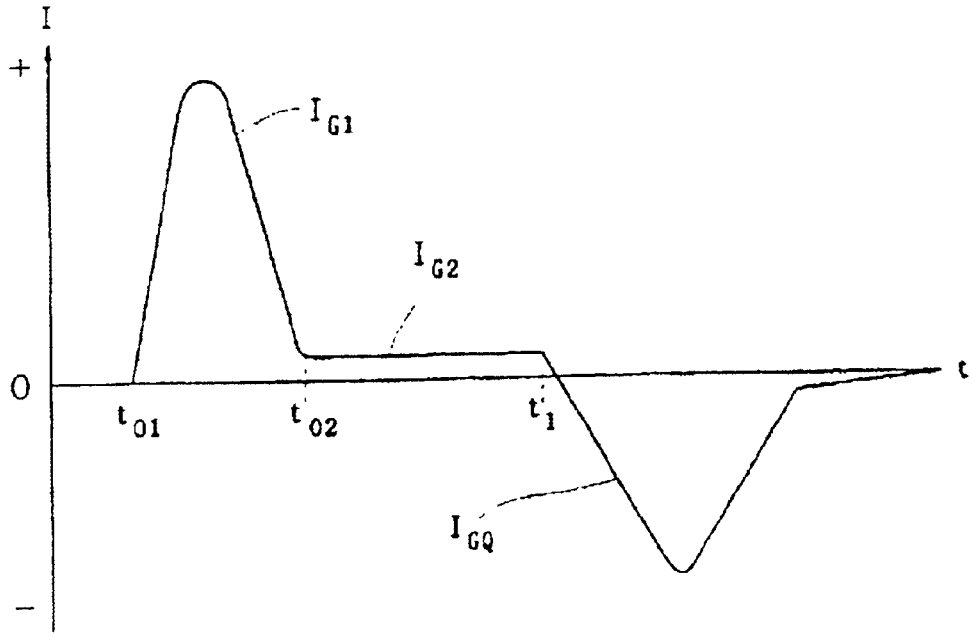
FIG. 3 shows a waveform of a current flowing in the gate side.

FIG. 1 is a diagram showing a circuit configuration of a semiconductor switching apparatus 10 in accordance with a first preferred embodiment of the present invention. In FIG. 1, a GTO 3 is shown as the semiconductor switching element, and a gate driver 4 (driving control circuit) is connected between a gate electrode 3G of the GTO 3 and a node 13 of a cathode electrode 3K. The gate driver 4 consists of a driving power supply 4a (power supply voltage $V_{GD}$, e.g., 20 V), a capacitor 4b, a wiring inductance 4c and a transistor 4d. The detailed configuration is shown in FIG. 2, as discussed later.

The gate driver 4 produces a turn-on control current $I_G$ for turning the GTO 3 on and applies the current $I_G$ to the gate electrode 3G through an interconnection path or a line L1. In response to that, the GTO 3 is turned on. Further, FIG. 1 shows a node 11 of an anode electrode 3A and a (main) power supply 9 for driving the semiconductor switching apparatus 10, namely, a power supply for main circuit (power supply voltage $V_{DD}$) of the semiconductor switching apparatus 10.

On the other hand, an inductance 1 suppress the rate of rise ($dI_{AKP}/dt$) of the main current $I_A$ which flows when the GTO 3 is turned on, and a circulating diode 2 circulates energy generated in the inductance 1 when the GTO 3 is turned off.

A peak voltage suppressing circuit 5 is connected between the node 11 of the anode electrode 3A and a node 12 of the cathode electrode 3K in parallel to the GTO 3 and suppresses only a peak voltage when the GTO 3 is turned off. The circuit 5 has a function of holding or clamping the voltage $V_{AK}$ to a prescribed voltage value which is determined according to a voltage blocking capability of the GTO 3 at its turn-off for a prescribed period.

Although a gate reverse current $I_{GQ}$ has been shunted from the main current $I_A$ and flows into the gate driver 4 in the background art, the main current $I_A$ is entirely carried (or commutated) to the node 12 through the gate driver 4 as the gate reverse current $I_{GQ}$ at a turn-off, with the absolute value of the rate of rise of the gate reverse current $dI_{GQ}/dt$ determined as large as possible (ideally, $|dI_{GQ}/dt|$ is infinity $\infty$), in the present invention. In other words, with the turn-off gain G ($=I_A/I_{GQ}$) represented by the absolute value of the ratio of the main current $I_A$ to the gate reverse current $I_{GQ}$ is determined [not more than 1 ($G \leqq 1$)] *at 1* (*G=1*), the main current $I_A$ is entirely commutated in a direction reverse to the turn-on control current $I_G$ through the gate driver 4 to the node 12, to turn the GTO 3 off. Then, the cathode current $I_K$ flowing direct from the anode electrode 3A towards the cathode electrode 3K inside the GTO 3 immediately stops flowing. In this meaning, the present invention achieves "commutation of the main current $I_A$", not "shunt of the main current $I_A$".

The rate of rise of gate current $dI_{GQ}/dt$ can be changed in response to the relation between the power supply voltage value $V_{GD}$ of the driving power supply 4a of the gate driver 4 and the inductance value of a loop R1. Accordingly, if the rate of rise $|dI_{GQ}/dt|$ is determined extremely large as near infinity $\infty$ as possible by appropriately setting the values of the driving power supply (main power supply) 4a and the loop R1, the main current $I_A$ can be entirely commutated towards the gate driver 4 in extremely short time.

On the other hand, it is not easy to achieve commutation of the gate reverse current $I_{GQ}$ by the gate driver 4 alone because of limitation of the possible power supply voltage $V_{GD}$ of the gate driver 4. It is practically possible, however, to determine the internal inductance value of the loop R1 so as to achieve the required absolute value of the rate of rise $dI_{GQ}/dt$ for the gate turn-off gain G of not more than 1, by setting the driving power supply voltage $V_{GD}$ to a practically possible value.

Then, it is required to reduce the value of the internal floating inductance in the loop or path R1 consisting of the line L1 from the gate electrode 3G to the gate driver 4, the gate driver 4, and a line L2 from the gate driver 4 to the cathode electrode 3K through the node 13 to achieve the desired value for the gate turn-off gain G of not more than 1.

Furthermore, the gate driver 4 should be so determined (or designed) as to have a capacitance enough to carry the gate reverse current $I_{GQ}$ not less than the main current $I_A$.

For example, when the power supply voltage $V_{GD}$ of the main power supply 4a of the gate driver 4 is determined 20 V and the absolute value of the rate of rise of gate current $|dI_{GQ}/dt|$ is determined 8000 A/μs, it is desirable that the inductance value of the loop R1 should be not more than 2.5 nH and the internal inductance value of the gate driver 4 should be not more than 1 nH.

FIG. 2 is a diagram of a specific circuit configuration of the gate driver 4 having the above-mentioned capacitance (or capability). FIG. 2 shows a driving power supply 50 serving as a main power supply for driving the gate driver 4, a secondary power supply 51 for the turn-on gate current, a secondary power supply 52 for a driving circuit 56 to drive a turn-on transistors Tr1 and Tr2, a secondary power supply 53 for the turn-off gate current, a secondary power supply 54 for a driving circuit 57 to drive a turn-off transistor Tr3, and a secondary power supply 55 for driving a unit of circuits 58 which generates a turn-on signal and a turn-off signal. The transistors Tr1, Tr2 and Tr3 serve as switches for supplying a turn-on high gate current $I_{G1}$, a turn-on stationary gate current $I_{G2}$ and the turn-off gate current $I_{Gq}$ (gate reverse current), respectively. The "turn-on control current $I_G$" is a general term for the turn-on high gate current $I_{G1}$ and the turn-on stationary gate current $I_{G2}$. Capacitors C1 and C2 are used for the turn-on gate current $I_G$ and the turn-off gate current $I_w$, respectively.

In the above-discussed gate driver circuit 4, when a control signal 62 is externally applied, a noise-ut circuit 59 cuts noise components out of the control signal 62, and a turn-on signal generation circuit 60 and a turn-off signal generation circuit 61, receiving the noise-cut control signal, generate a turn-on signal 63 and a turn-off signal 64 and supply the corresponding driving circuits 56 and 57 with the signals 63 and 64, respectively.

Operations of the driving circuits 56 and 57 which receive the signals 63 and 64 respectively are as follows. At time $t_{01}$, the driving circuit 56 generates a signal which can drive the transistor Tr1 and supplies the base of transistor Tr1 with the signal. Since the capacitors C1 and C2 are charged by the secondary power supplies 51 and 53 respectively at this time, the turn-on high gate current $I_{G1}$ is carried from the capacitor C1 to the GTO 3 through the transistor Tr1. At time $t_{02}$, the driving circuit 56 stops supplying the base current of the transistor Tr1, and in turn generates a base current which can drive the transistor Tr2 and supplies the transistor Tr2 with the base current. The transistor Tr1 is thereby turned off and the transistor Tr2 is instead turned on. The turn-on stationary gate current $I_{G2}$ is carried from the capacitor C1 to the GTO 3 through the transistor Tr2.

At time $t_1$, the driving circuit 56 stops supplying the base current of the transistor Tr2, and the driving circuit 57 generates a base current which can turn the transistor Tr3 on in response to the signal 64 and supplies the base of transistor Tr3 with the base current. The transistor Tr2 is thereby turned off and the transistor Tr3 is instead turned on. The electric charges accumulated in the capacitors C2 are discharged through the transistor Tr3, and accordingly the turn-off gate current $I_{GQ}$ flows from the gate of the GTO 3 to the node 13 of the cathode electrode 3K of the GTO 3 through the transistor Tr3. The turn-off gate current IQ becomes the value equivalent to the absolute value of the main current $I_A$ or more in extremely short time, and in contrast the cathode current is reduced to 0 in extremely short time.

To achieve the rate of rise $dI_{GQ}/dt$ for the turn-off gain G of not more than 1, it is required to reduce the inductance value of the whole loop R1 including the interconnection paths of the gate driver 4, as discussed above. That is desirably achieved by improvements of system parts constituting the interconnection of the GTO elements and the package structure.

Figure 18:
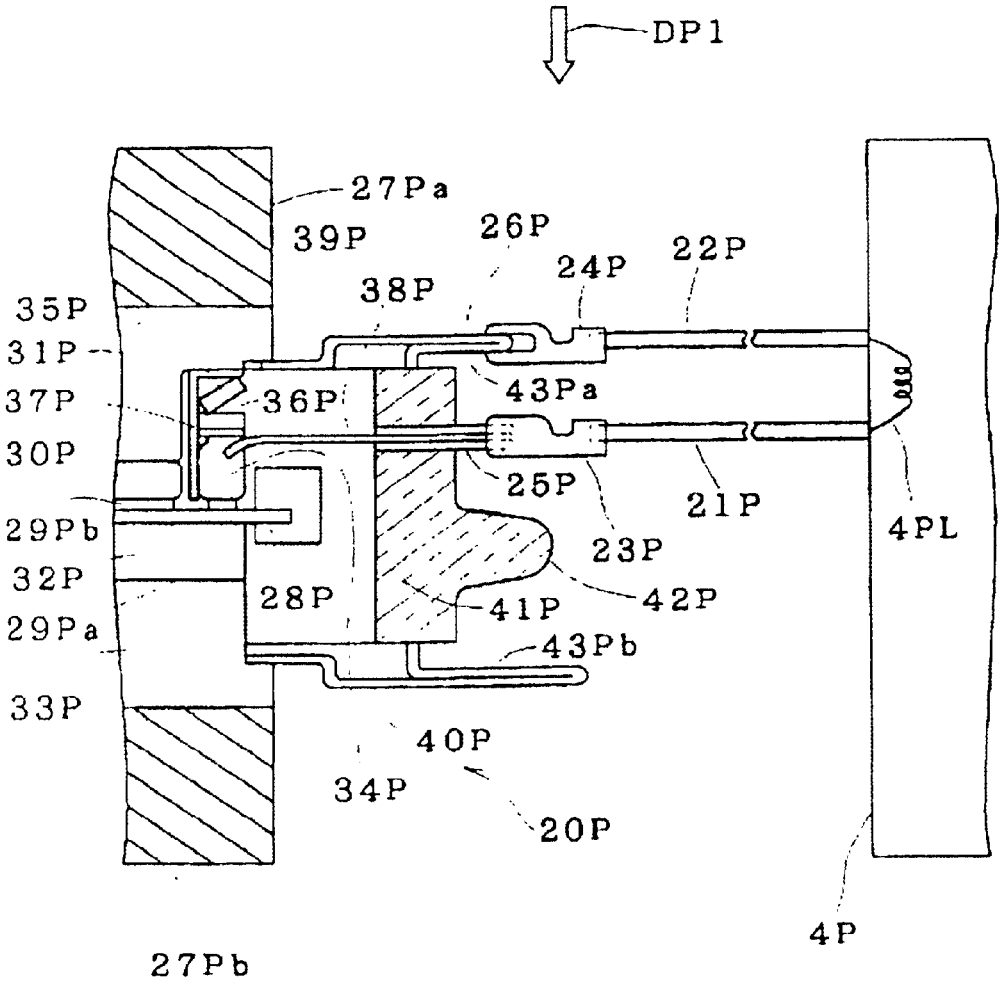
FIG. 18 (BACKGROUND ART)
FIG. 18 is a sectional view of a background-art GTO element package.
Figure 19:
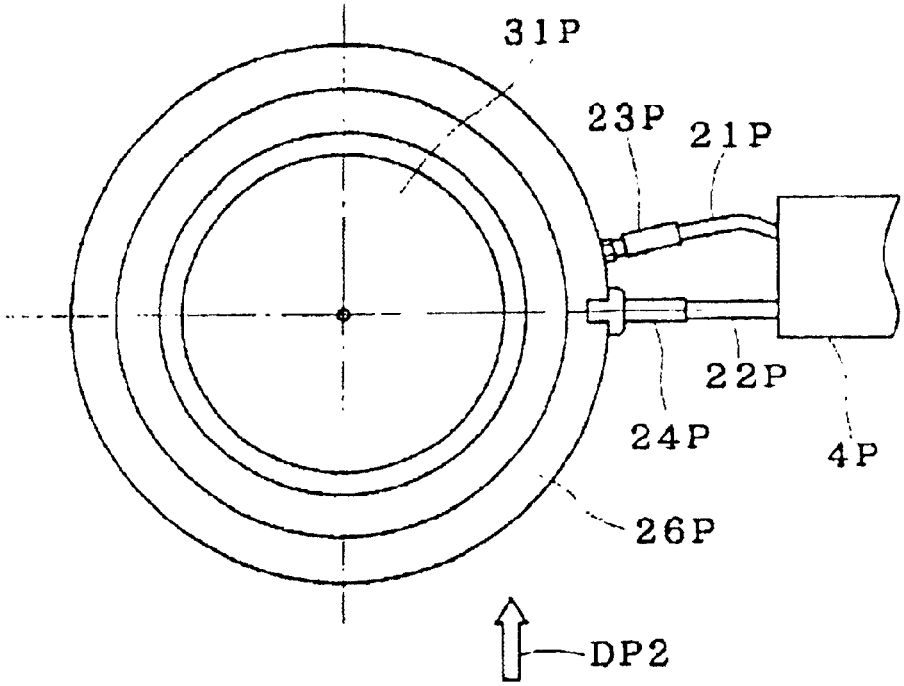
FIG. 19 is an external plan view of the background-art GTO element package.
Figure 20:
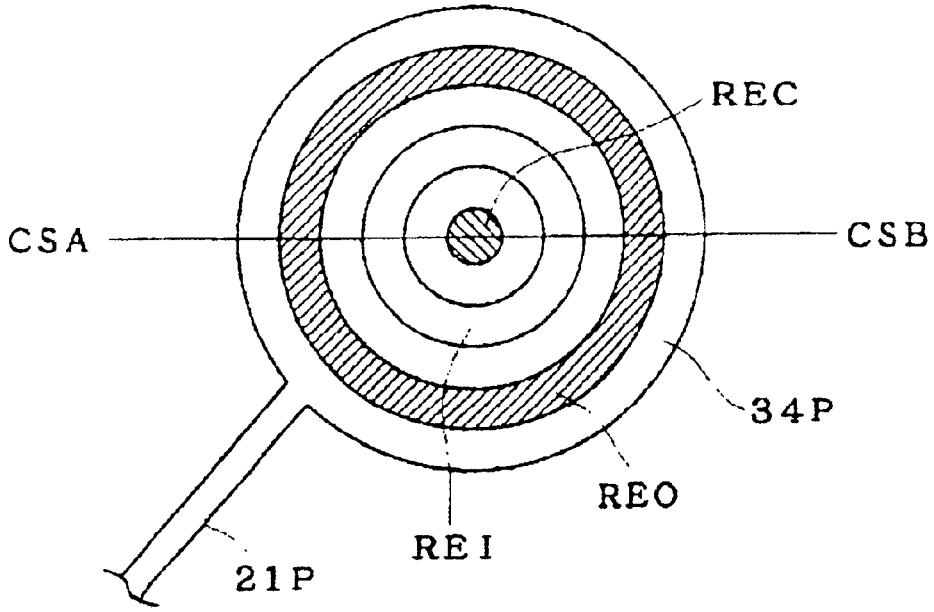
FIGS. 20 and 21 illustrate a problem in the background art.

The background-art GTO 3P has the package structure as shown in FIGS. 18 and 19, the internal inductance of the GTO element 20P (the inductance in the following path: the lead 21P~the ring-shaped gate electrode 34P~the cathode electrode 30P~the lead 22P) has a value of e.g., as large as 50 nH. With this inductance value, it is impossible to achieve the rate of rise $dI_{GQ}/dt$ of about 8000 A/μs. To reduce the internal inductance value of the GTO element (or GTO device) 20P to a desired value, e.g., not more than 2 nH, it is necessary to reduce the inductance and the resistance produced by the joints between the gate joining member (or terminal) 23P and the gate terminal 25P and between the cathode joining member 24P and the cathode terminal 26P, the joints between the external gate lead 21P and the gate driver 4P and between the external cathode lead 22P and the gate driver 4P, the inductance value of the gate lead 38P, and the inductance and resistance values of the external gate lead 21P and the external cathode lead 22P which account for 90% of the whole inductance value of the loop R1.

Through a study of the package structure of the GTO elements from the above viewpoint and improvements thereof, the present invention provides a pressure-contact type semiconductor device having a structure as discussed below.

Figure 4:
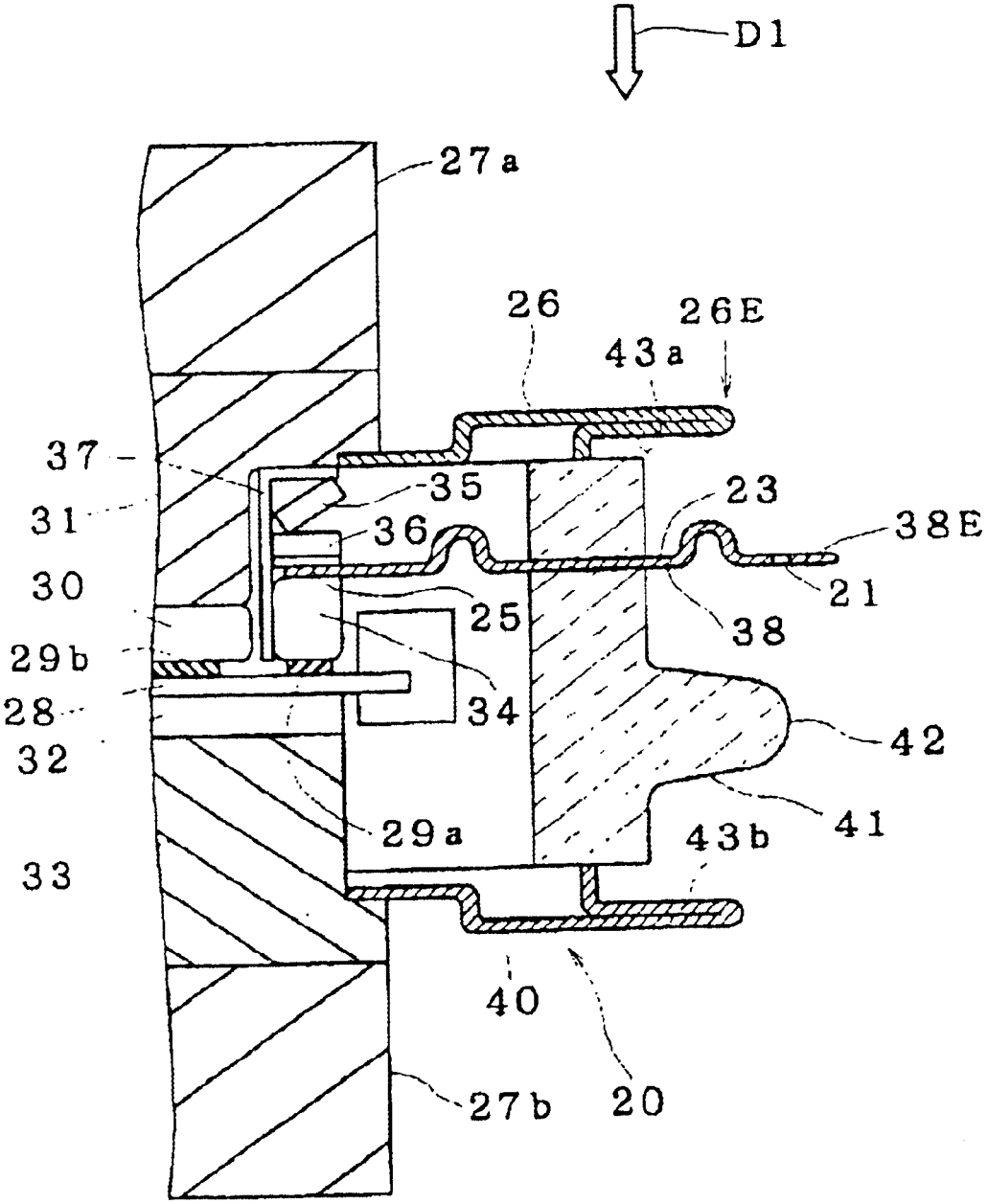
FIG. 4 is a sectional view of a GTO element package of the present invention.
Figure 5:
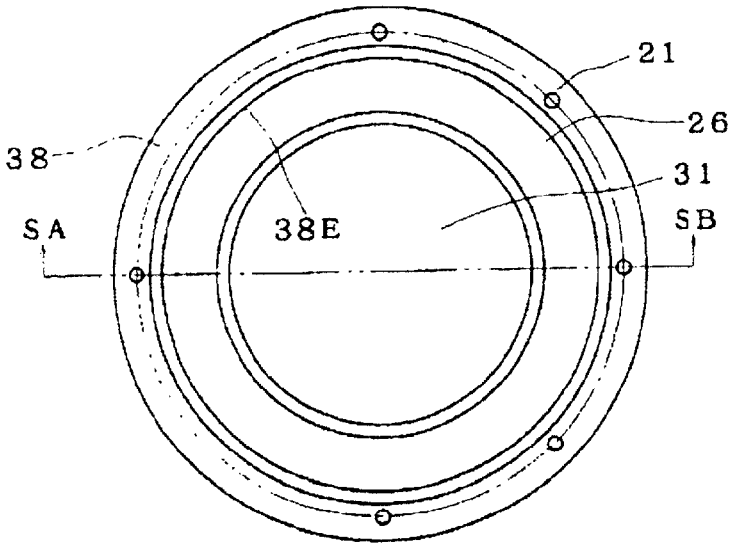
FIG. 5 is an external plan view of the GTO element package of the present invention.

FIG. 4 is a cross-section of a pressure-contact type GTO element 20 and stacked electrodes 27a and 27b which apply pressure to the GTO element 20 in a vertical direction, and FIG. 5 is an elevation of the GTO element 20 viewed from the direction of the arrow D1 of FIG. 4 (exclusive of the stacked electrode 27a). In other words, FIG. 4 is the cross-section taken along the line SA-SB of FIG. 5.

Figure 21:
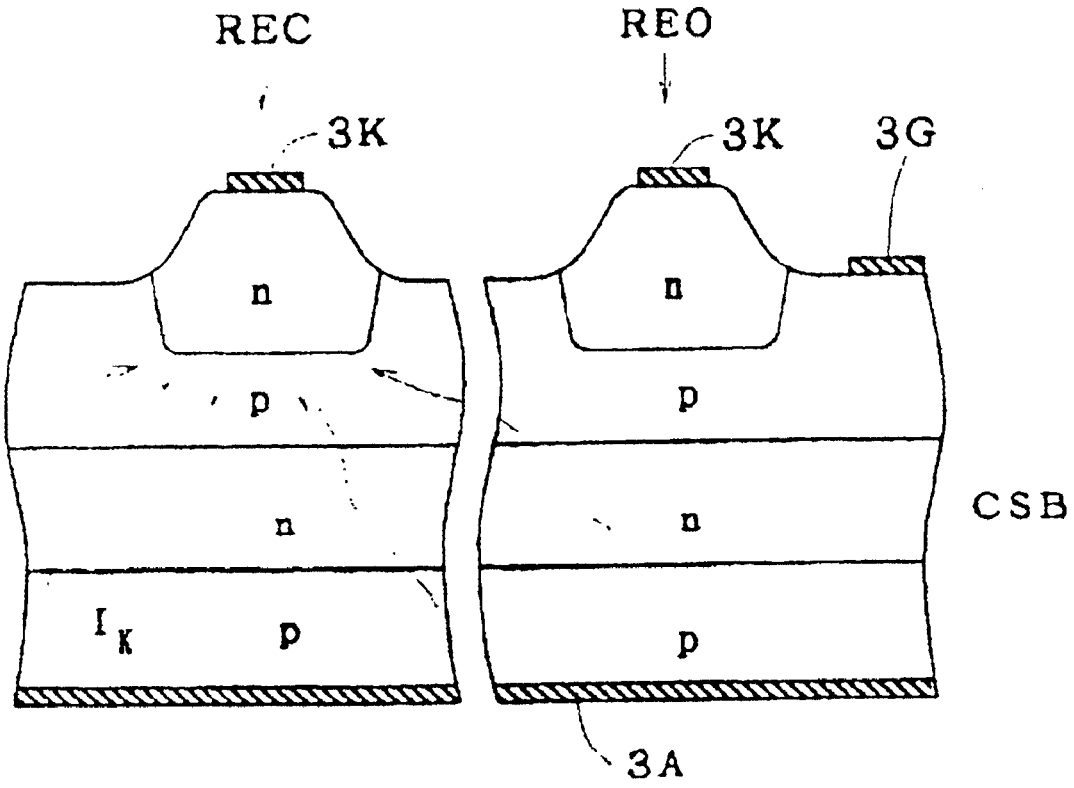

FIGS. 4 and 5 show the pressure-contact type GTO element 20, in other words, the whole of GTO element. A semiconductor substrate 28 is provided with segments of the GTO. A gate electrode 29a made of Al (Aluminum) is formed on an outermost peripheral portion of an upper surface of the semiconductor substrate (or semiconductor wafer) 28, and each of cathode electrodes 29b is formed inside the gate electrode 29a on the upper surface of the semiconductor substrate 28. The structure of the segment of the GTO is the same as those of FIG. 21.

A cathode strain relieving plate (or cathode metal plate) 30 and a cathode post electrode 31 are stacked (or assembled) in this order on an upper surface of the cathode electrode 29b provided on the upper surface of the semiconductor substrate 28. An anode strain relieving plate 32 and an anode post electrode 33 are stacked in this order on a surface of an anode electrode (not shown) provided on a bottom surface of the semiconductor substrate 28 (opposite to the cathode electrode 29b). A ring-shaped gate electrode 34 is in contact with an upper surface of the gate electrode 29a on the semiconductor substrate 28, and a ring-shaped gate terminal 38 is formed of an annular metal plate, having an inner peripheral plane 25 which is located in contact with the ring-shaped gate electrode 34 so as to be slidable thereover. A belleville spring or wave spring 35 which is an elastic body pushes the ring-shaped gate terminal 38 and the ring-shaped gate electrode 34 against the gate electrode 29a through an annular insulator 36. An insulating sheet (insulating body) 37 is provided to isolate the ring-shaped gate electrode 34 from the cathode strain relieving plate 30 and the post electrode 31. A first flange 26 has one end fitted into the cathode post electrode 31, and a second flange 40 has one end fitted into the anode post electrode 33. An insulating tube 41 made of ceramic and the like is separated into upper and lower portions with the ring-shaped gate terminal 38 interposed therebetween and has a projection 42. An outer peripheral portion 23 of the ring-shaped gate terminal 38 is projected outside the insulating tube (or ceramic) 41 and provided with a plurality of mounting holes 21 at predetermined spaces inside an outer end 38E of the ring-shaped gate terminal 38. An end portion 43a of the insulating tube 41 protruded through its upper surface is fitted airtightly to the other end 26E of the first flange 26 and another end portion 43b of the insulating tube 41 protruded through its lower surface is fitted airtightly to the other end of the second flange 40, thereby ensuring a closed package structure of the GTO element 20. Furthermore, inert gas is substituted for the inside of the GTO element 20.

Figure 6:
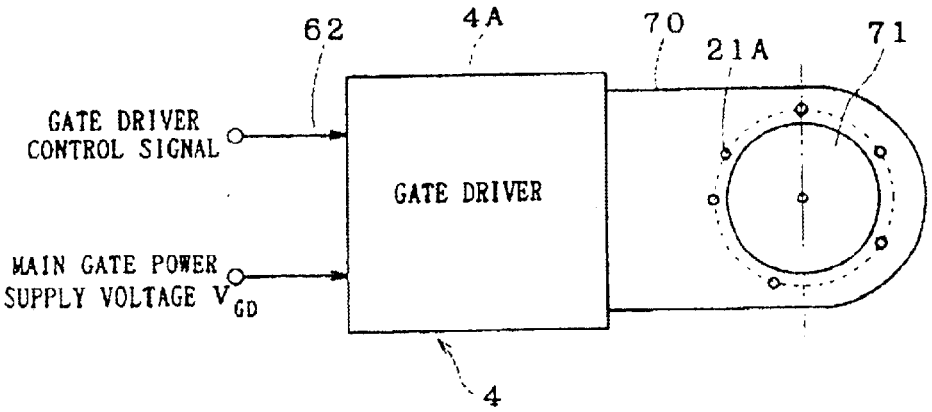
FIG. 6 is an external plan view of a gate driver of the present invention.
Figure 7:
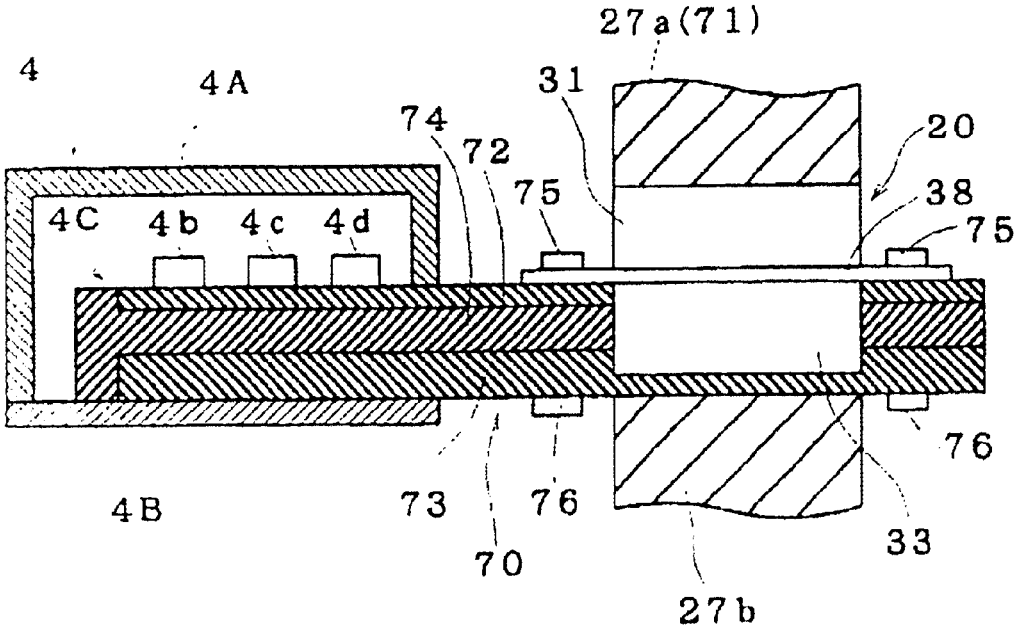
FIG. 7 is a sectional view of connection between the GTO element package and the gate driver of the present invention.

FIG. 6 is a plan view showing the mechanism of the gate driver 4, and FIG. 7 is a cross section of the gate driver 4 and the GTO element 20 of FIGS. 4 and 5 (to which pressure is applied by the stacked electrodes 27a and 27b) attached thereto. FIGS. 6 and 7 show a case 4A which covers the gate driver body 4C, a case 4B which serves as a pedestal for the gate driver body 4C. The reference numeral 70 represents the whole substrate provided with circuit patterns for establishing an electrical connection between the gate driver body 4 and the GTO element 20. The substrate 70 is a substitution for the gate lead 21P and the cathode lead 22P (see FIG. 18) and has a strength enough to support the weight of the GTO element 20. A cathode electrode 71 is connected to the cathode electrode 29b of the GTO element 20 under pressure, which corresponds to the stacked electrode 27a. Mounting holes 21A are provided on the substrate 70 correspondingly to the mounting holes 21 of the gate driver 4 to connect the GTO element 20 to the gate driver 4. For example, about six holes are required to connect the GTO element 20 to the gate driver 4.

The substrate 70 has two circuit pattern substrates which are opposed to each other with the insulator interposed therebetween. Specifically, the substrate 70 has a gate lead substrate 72, a cathode lead substrate 73 and an insulator 74 for making isolation between the substrates 72 and 73. Such multilayered substrate structure allows reduction of the internal inductance of the gate driver 4. The GTO element 20 is connected to the gate driver body 4C with screws 75 and 76, or by welding, caulking and the like.

As discussed above, the airtight package (20) of the GTO 3 has the ring-shaped or disk-shaped gate electrode 38 extending from a side of the semiconductor substrate on which the internal gate electrode 29a is formed towards the gate driver body 4C, and can be connected to the gate driver 4 by joining and fitting the outer peripheral portion of the ring-shaped gate electrode 38 direct to the substrate 70 which extends from the gate driver body 4C through the mounting holes 21A. Thus, this connection between the GTO 3 and the gate driver 4 needs no lead line. Therefore, all of the problems in the background-art structure are resolved. Specifically discussing, the inductance and resistance produced by joints between the internal gate lead portion of the GTO element and the gate and cathode terminals are substantially reduced by using the above gate lead whose drawing portion is of disk-like structure, and voltage drop of the inductance and resistance by the joint between the external gate lead line and the gate driver is substantially reduced by connecting the disk-like gate lead portion or the whole gate electrode 38 direct to the gate current conducting substrate 70. Moreover, the problem of the inductance of the external gate lead line which conventionally accounts for 90% of all the inductance of the loop R1 is resolved in the present invention since no gate lead line is used.

Thus, it becomes possible to reduce the internal inductance of the GTO element 20 (3) and the internal inductance of the gate driver 4. In addition to the improvements, with the above invented connection between the GTO element 20 and gate driver 4 (see FIG. 7), the rate of rise $dI_{GQ}/dt$ for the turn-off of the GTO 3 under the condition that the turn-off gain $G \leqq 1$ is practically achieved.

Figure 8:
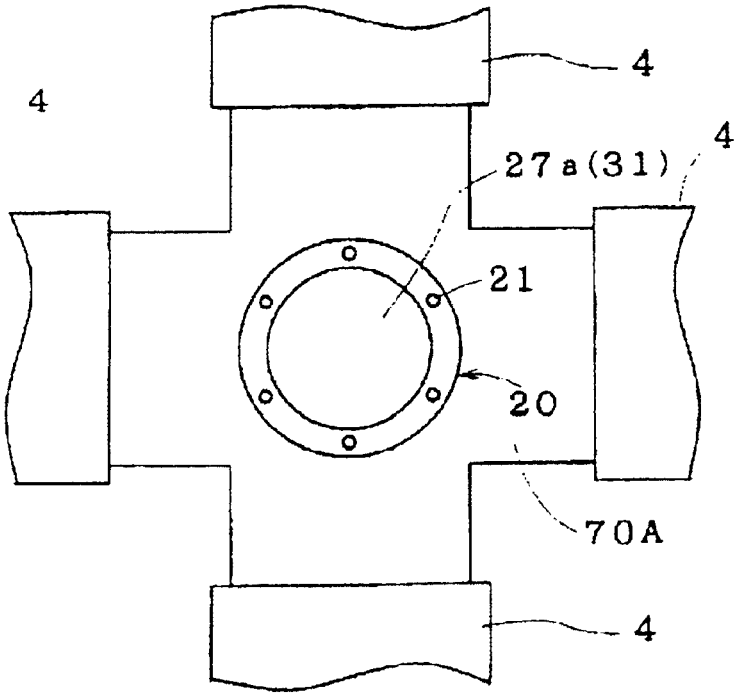
FIG. 8 is a plan view of the gate driver in a case of multidirectionally drawing out a gate reverse current.

Furthermore, the gate current may be drawn in two or four diagonal directions, or more directions, by using a substrate 70A as shown in the plan view of FIG. 8.

Figure 9:
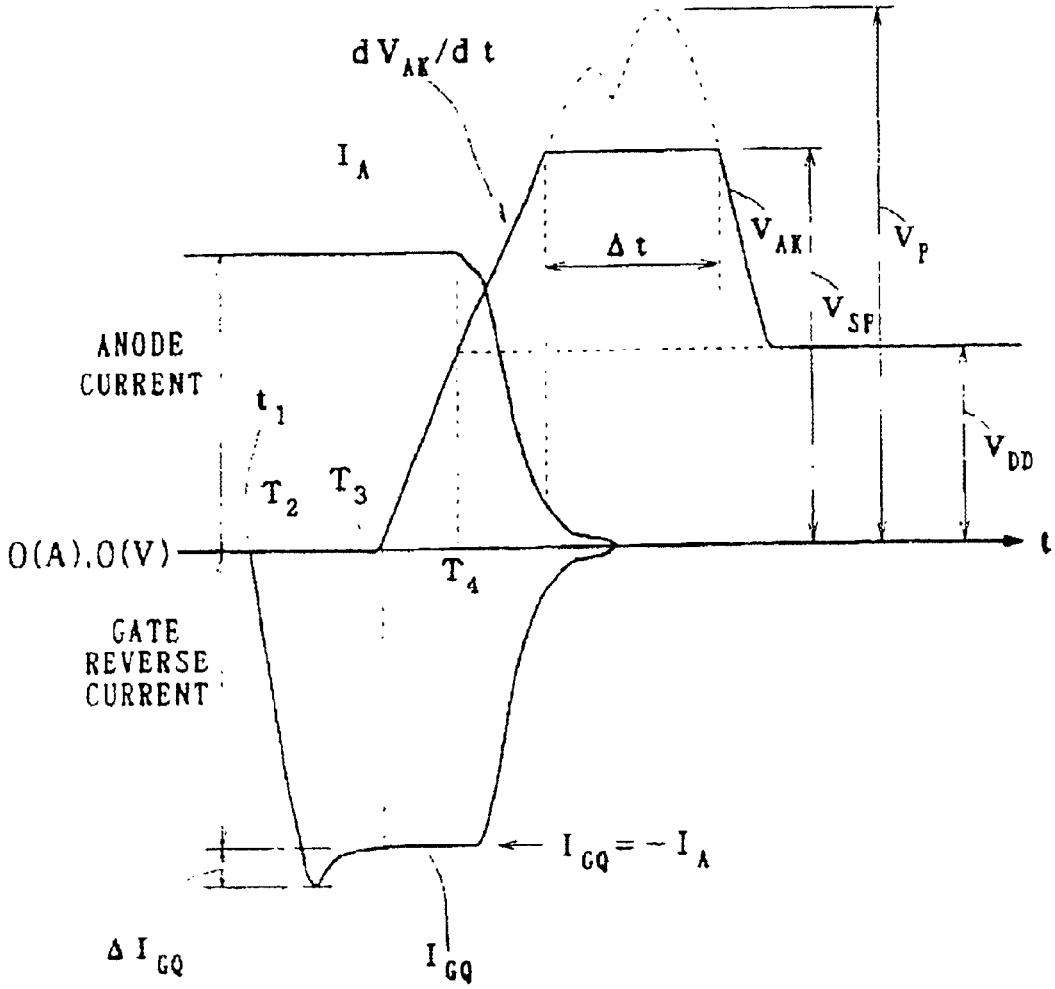
FIG. 9 shows an operation of the semiconductor switching apparatus in the first preferred embodiment of the present invention.

An operation of the semiconductor switching apparatus having the above circuit configuration and mechanism will be discussed, referring to FIGS. 9 and 10. FIG. 9 shows waveforms and FIG. 10 shows an equivalent model of a circuit configuration consisting of a PNP transistor 80 and an NPN transistor 81 as a substitute for the GTO 3.

In FIG. 9, when the gate driver 4 raises the gate reverse current $I_{GQ}$ with a sharp rate of rise of the current in response to the control signal 62 (see FIG. 2) while the GTO 3 is in an on-state and the anode current $I_A$ flows (at time $t_1$), the gate reverse current $I_{GQ}$ reaches a current value which is equivalent in absolute value to the anode electrode $I_A$ ($I_{GQ}=-I_A$) in extremely short period (at time $T_2$). In this state, the anode current $I_A$ flowing into the anode electrode 3A is entirely commutated to the gate driver 4 through the gate electrode 3G and the connection path L1. Then, the relation |the anode current $I_A$ of the GTO 3|[≦]=| the gate reverse current $I_{GQ}$| holds and the cathode current $I_K=0$. After that, the state of $|I_A|$[≦]=$|I_{GQ}|$ remains until the GTO 3 is completely turned off.

A current difference $\Delta I_{GQ}$ of FIG. 9 is regarded as a recovery current of the NPN transistor 81 of FIG. 10, and is produced as follows. Referring to FIG. 10, in a state where the anode current $I_A$ flows in the semiconductor substrate after the turn-on of the GTO 3, the anode current $I_A$ is carried from the anode electrode 3A of the GTO 3, separating into loops 82 and 83, to the cathode electrode 3K. When the state of the GTO 3 is shifted to a turn-off, the anode current $I_A$ is entirely pulled to the gate driver 4 intensely to flow into loops 84 and 85 separately. The base current of the NPN transistor 81 is then inverted from positive direction to negative direction, and the NPN transistor 81 is abruptly turned off and consequently internal carriers are carried superimposedly as the recovery current. The increase in current by the recovery current is the above current difference $\Delta I_{GQ}$, and a relation |the gate reverse current $I_{GQ}$|>|the anode current $I_A$| holds.

Figure 10:
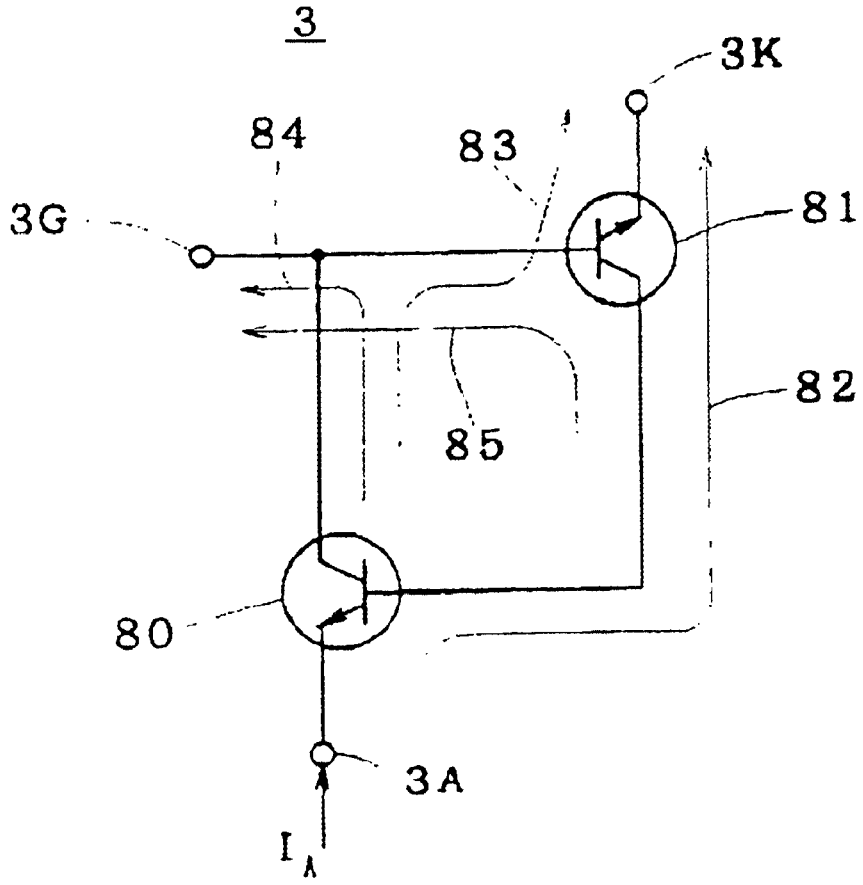
FIG. 10 is a diagram of an equivalent model of the GTO.

When the NPN transistor 81 of FIG. 10 is turned off in the state where |the gate reverse current $I_{GQ}$|>|the anode current $I_A$|, the base current of the PNP transistor 80 becomes decreased and the state of the PNP transistor 80 is shifted to a turn-off.

When a voltage blocking function (or voltage blocking capability) of the PNP transistor 80 begins to recover (at time $T_3$), the anode-cathode voltage $V_{AK}$ of FIG. 9 starts rising. When the anode-cathode voltage $V_{AK}$ reaches the power supply voltage value $V_{DD}$ (at time $T_4$), the anode current $I_A$ starts falling and the state of the GTO 3 is shifted to a turn-off. The rate of rise of anode-cathode voltage $dV_{AK}/dt$ depends only on the speed of recovery of the voltage blocking function of the GTO 3, and is unaffected by externally-connected circuits and the like. In this point, the present invention has a clear difference from the background-art in which the rate of rise of the anode-cathode voltage depends on the snubber capacitor $C_S$.

The peak voltage (or surge voltage) $V_P$ of FIG. 9 in the present invention is generated by an electric energy (its energy is expressed as $E=\frac{1}{2}\times L\times 1^2$) caused by the anode reactor L in the main circuit (the loop from the main power supply 9, through the node 11, the GTO 3, the node 12, back to the main power supply 9) upon the main power supply voltage $V_{DD}$ when the GTO 3 is turned off. If a peak voltage $V_P$ would be over the voltage blocking capability of the GTO 3, the GTO 3 would be failed. For this reason, it is necessary to connect the peak voltage suppressing circuit 5 between the nodes 11 and 12 in parallel to the GTO 3. The peak voltage suppressing circuit 5 suppresses the anode-cathode voltage $V_{AK}$ rising on at the turn-off of the GTO 3 towards the peak voltage $V_P$ so as not to exceed the voltage blocking capability of the GTO 3. The peak voltage suppressing circuit 5 of FIG. 1 which has the above function is e.g., a voltage clamp circuit consisting of a Zener diode, a varistor, a selestor, an arrester and the like. The peak voltage suppressing circuit 5 holds the anode-cathode voltage $V_{AK}$ to a predetermined voltage within a limit beyond which the voltage $V_{AK}$ would exceed the voltage blocking capability of the GTO 3, namely, a suppressed peak voltage $V_{SP}$ for a predetermined time $\Delta t$ (see FIG. 9). The predetermined time $\Delta t$ is a period from the point in time when the voltage $V_{AK}$, rising on after the turn-off of the GTO 3, reaches the predetermined voltage $V_{SP}$ to the point in time when the voltage $V_{AK}$, rising on and reaching once the peak voltage $V_P$ without the circuit 5, falls again to the predetermined voltage $V_{SP}$. Thus, the anode-cathode voltage $V_{AK}$ does not reach the peak voltage $V_P$, and therefore no failure of the GTO 3 occurs.

As discussed above, the GTO 3 is turned off, with the rate of rise $dI_{GQ}/dt$ of FIG. 11 controlled within the range RA. In FIG. 11, a point PA on a curve CA is a commutation point where the main current $I_A$ is commutated towards the gate driver 4. This case is an ideal one with no recovery current. In actual, [because of] *though* the recovery current *is* superimposed on the commutated main current *during an initial stage of the communication*, the GTO 3 is turned off within the limit where the turn-off gain G[<]=1 *after the recovery*.

Figure 12:
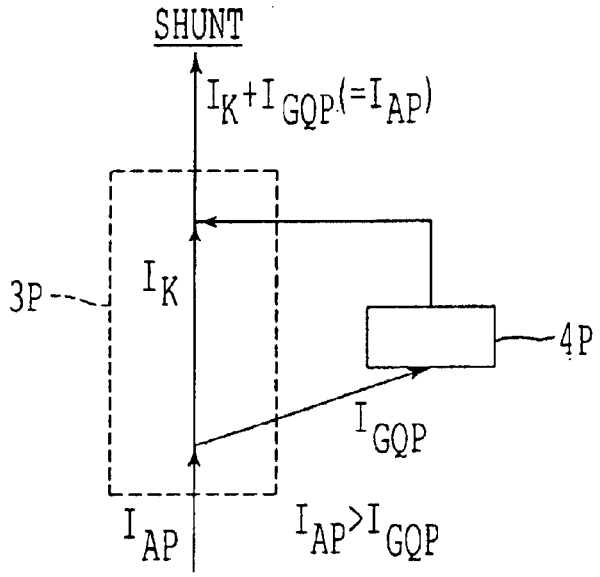
FIG. 12 shows a flow of a main current at a turn-off in the background art.
Figure 13:
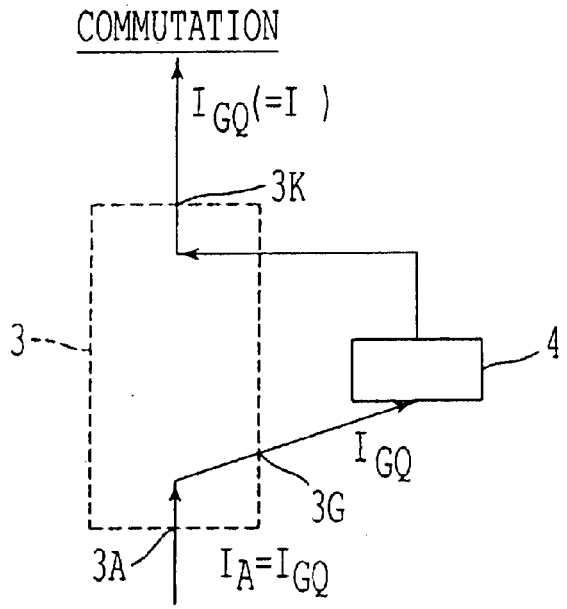
FIG. 13 shows a flow of a main current at a turn-off in the present invention.

FIGS. 12 and 13 show a flow of the main current in the background art and the present invention, respectively, for comparison. In the background-art, e.g., apparatus disclosed in Japanese Patent Application Laid Open Gazette 5-111262 (Swiss Application No. 91 1061919) and Japanese Patent Application Laid Open Gazette 6-188411 (German Application No. P4227063), the cathode current $I_K$ flows in the GTO 3P even at the turn-off, as shown in FIG. 12. Specifically, the main current $I_A$ is shunt or divided into the cathode current $I_K$ and the gate reverse current $I_{GQP}$ at the turn-off. In this case, the cathode current $I_K$ is intensively carried into some of the segments, even if the cathode current $I_K$ in each segment is small, and thus the problem of failure of the GTO element is inherent in such apparatus.

In contrast, no cathode current flows and the main current $I_A$ is entirely commutated into the path towards the gate driver 4 at the turn-off in the present invention, as shown in FIG. 13. [With] *However, during the initial stage of the communication with* generation of the recovery current, the absolute value of the gate reverse current $I_{GQ}$ is equivalent to the sum of the absolute value of the main current $I_A$ and the absolute value of the recovery current, and therefore the relation $|I_{GQ}|\geqq|I_A|$ holds ($|I_{GQP}|<|I_A|$ in the background art).

Thus, in the present invention, the relation |the anode current $I_A$[≦]=| the gate reverse current $I_{GQ}$| is true while the GTO 3 is in a turn-off mode. With the new gate commutation system, since the cathode current $I_K$=0 when the GTO 3 is turned off, and specifically, no cathode current flows in the cathode side inside the GTO 3, it is possible to absolutely prevent the current crowding from occurring locally in the cathode side, which has been a cause of turn-off failure. Therefore, there is less possibility of breakdown of the apparatus due to the turn-off failure in the present invention, and substantially high reliability of the apparatus is achieved. That is the core of the present invention and this advantageous effect is not achieved by combination of background-art techniques disclosed in the above documents.

In addition to that, since the peak voltage suppressing circuit 5 which suppresses the rise in the anode-cathode voltage $V_{AK}$ and cuts the surge voltage is provided to cut the spike voltage, no spike voltage is developed. That eliminates the necessity for the snubber capacitor $C_S$ which has been conventionally required to discharge the electric charges which arc accumulated at the turn-off. Thus, since the snubber circuit which has been an essential of the background art is not needed, it is possible to achieve size-reduction, simplification, cost-reduction and which efficiency of the apparatus.

<The Second Preferred Embodiment>

Figure 14:
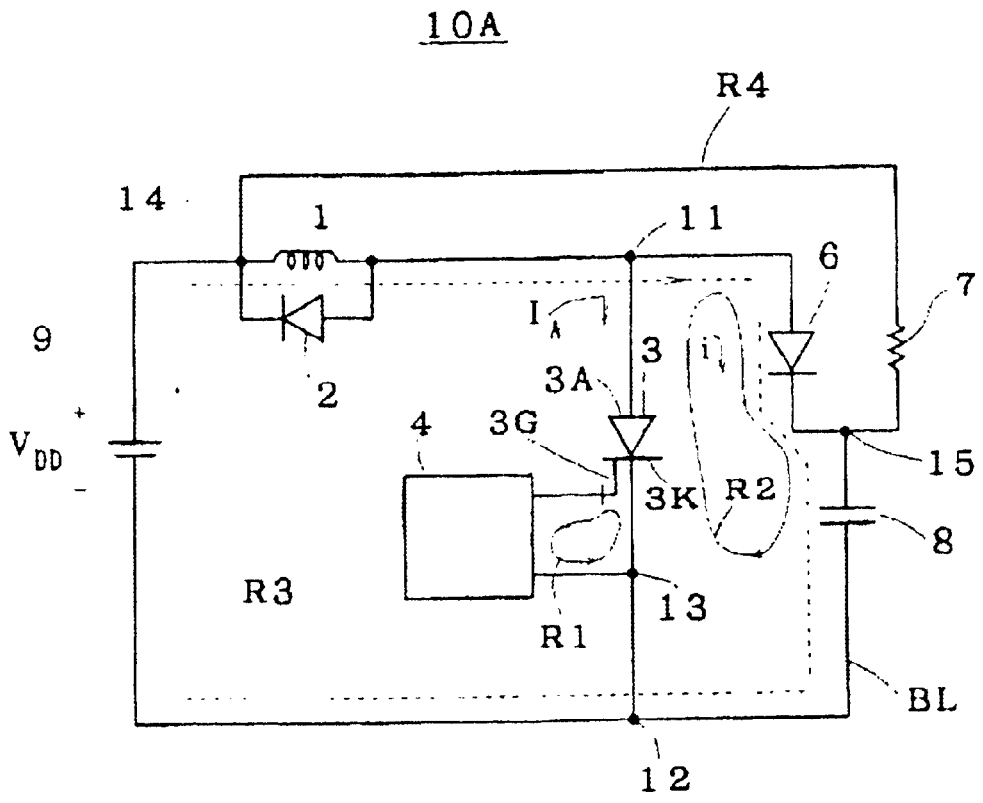
FIG. 14 is a circuit diagram of a semiconductor switching apparatus in accordance with a second preferred embodiment of the present invention.

FIG. 14 is a circuit diagram of a semiconductor switching apparatus in accordance with the second preferred embodiment of the present invention. In FIG. 14, like elements arc given the same reference characters as those of FIG. 1. The semiconductor switching apparatus of the second preferred embodiment uses the same package structure of the GTO 3 and mechanism of the gate driver 4 as those of the first preferred embodiment. A diode 6, a resistor (or resistive element) 7 and a capacitor 8 arc elements constituting a protective circuit which suppresses or reduces the dissipation due to the spike voltage and the peak voltage (surge voltage) developed when the GTO 3 is brought into a turn-off state. Especially, a characteristic feature of this configuration lies in that one end 15 of the capacitor (or capacitive element) 8 which is included in a bypass line BL disposed between the nodes 11 and 12 in parallel to the GTO 3 is connected to a main power supply 9 through an interconnection path R4 which includes the resistor 7 and is connected to the power supply 9 at a node 14.

Figure 15:
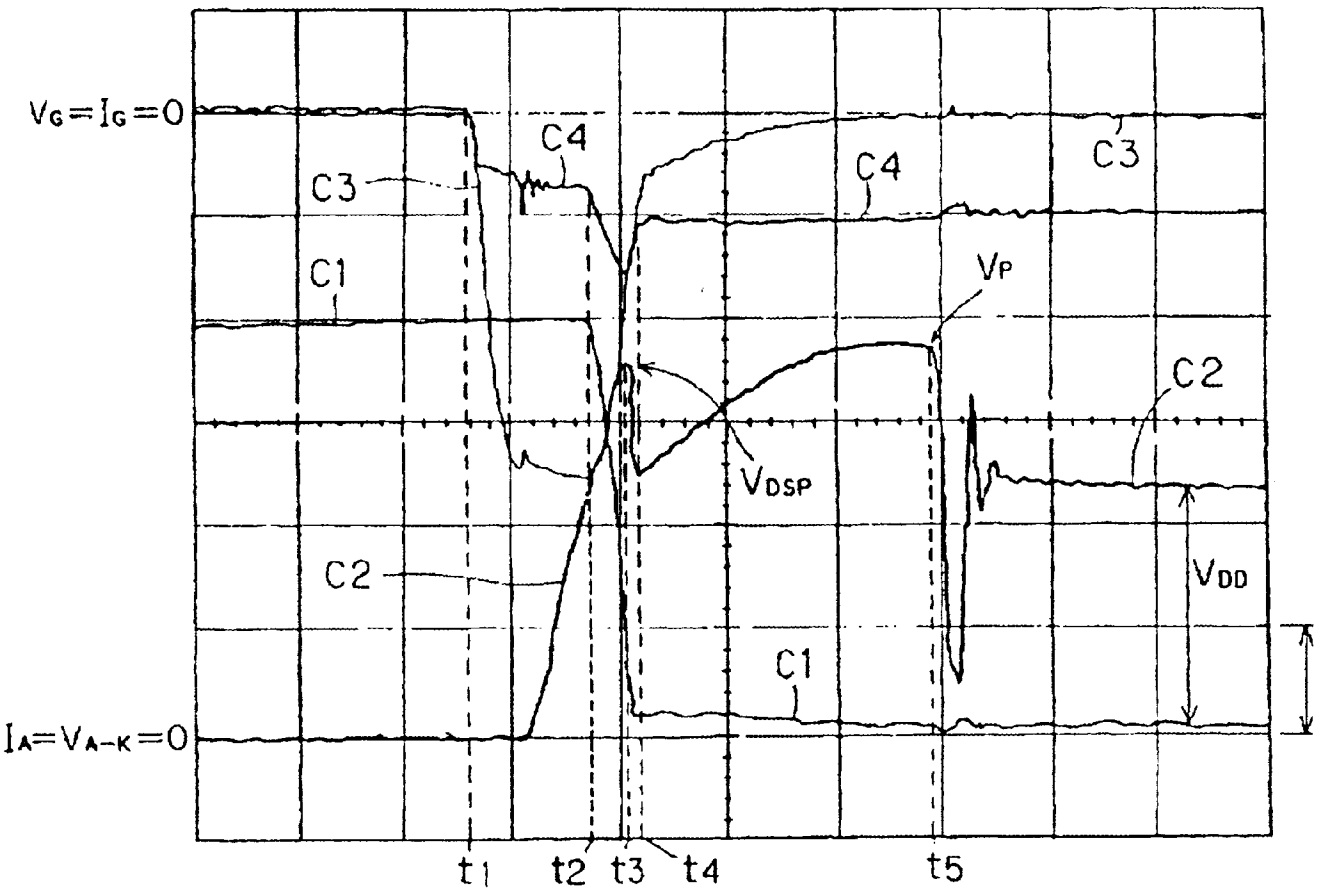
FIG. 15 shows observed waveforms by a circuit in the second preferred embodiment of the present invention.
Figure 16:
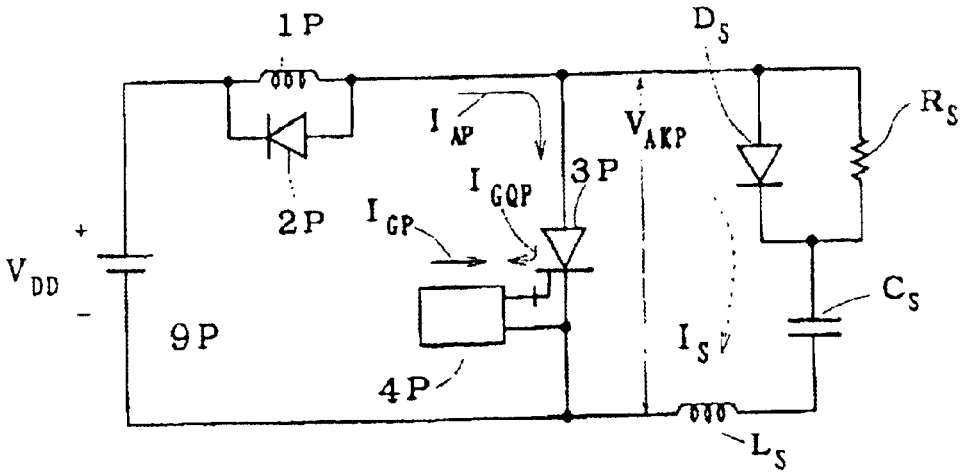
FIG. 16 (PRIOR ART)
FIG. 16 is a diagram of a circuit of a semiconductor switching apparatus in the prior art.
Figure 17:
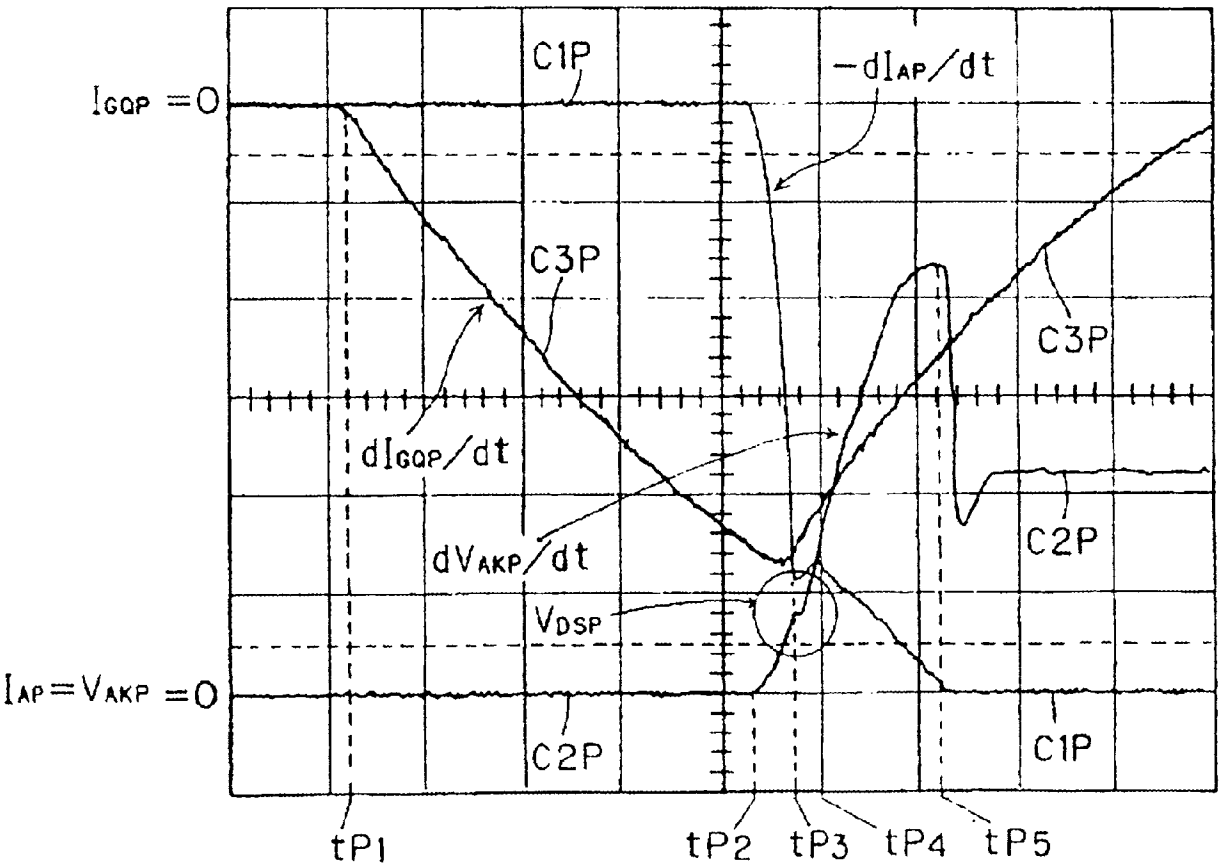
FIG. 17 shows observed waveforms by the background-art circuit.

Operations of the semiconductor switching apparatus 10A having the above configuration and the GTO 3 will be discussed, referring to the observed waveforms of FIG. 15.

The operation of the GTO 3 in this case is the same as that of the first preferred embodiment, except an operation of suppressing the peak voltage of the anode-cathode voltage $V_{AK}$. The observed waveforms of FIG. 15 represent a case where the anode current $I_A$=1000 (A/d), the anode-cathode voltage $V_{AK}$=1000 (V/d), the turn-off gate current $I_{GQ}$=1200 (A/d), the power supply voltage $V_{GD}$=20 (V/d), and t=2 ($\mu$s/d). In FIG. 15, curves C1, C2, C3 and C4 represent the observed waveforms of the anode current $I_A$, the anode-cathode voltage $V_{AK}$, the gate reverse current $I_{GQ}$ and a gate voltage $V_G$, respectively.

In FIG. 14, the capacitor 8 is always[]charged with the power supply voltage $V_{DD}$ through the resistor 7, and during a turn-off operation, currents generated by excess voltages ($V_{DSP}-V_{DD}$, $V_P-V_{DD}$) of the developed spike voltage $V_{DSP}$ and peak voltage $V_P$ beyond the power supply voltage $V_{DD}$ are absorbed in the capacitor 8 through the diode 6. Thus, only the currents by the excess voltages are additionally charged in the capacitor 8 only for excess time.

The above operation will be discussed, referring to FIG. 15. Until the anode-cathode voltage $V_{AK}$ reaches the power supply voltage $V_{DD}$, the capacitor 8 does not work, and the rate of rise $dI_{GQ}/dt$ in this period ($t_2-t_1$) depends on the capability of the GTO 3 (at this time, the main current $I_A$ is entirely commutated towards the gate driver 4). When the anode-cathode voltage $V_{AK}$ reaches the power supply voltage $V_{DD}$ and the anode current $I_A$ starts falling (at time $t_2$), the main current flowing into the node 11 starts flowing towards the capacitor 8 through the diode 6, i.e., into the bypass line BL. At this time, spike voltage $V_{DSP}$ is generated by the rate of rise di/dt of the bypass current i which flows into the bypass line BL and a floating inductance ($L_n$) in a closed circuit, or a first loop R2, consisting of the GTO 3, the diode 6 and the capacitor 8. This is the spike voltage $V_{DSP}$ as shown in FIG. 15 (at time $t_3$). After that, the difference between the peak voltage $V_P$ of the anode-cathode voltage $V_{AK}$ and the power supply voltage $V_{DD}$ is absorbed in the capacitor 8 until time $t_3$. The capacitance value of the capacitor 8 is appropriately determined so that the overcharged voltage absorbed in the capacitor 8 may not exceed the voltage blocking capability of the GTO 3. In other words, the peak value $V_P$ of the anode-cathode voltage $V_{AK}$ from time $t_4$ to $t_5$ is determined by the capacitance value of the capacitor 8 so as not to exceed the voltage blocking capability of the GTO 3.

Furthermore, the overcharged electric charges absorbed in the capacitor 8 are discharged through the resistor 7 towards the power supply 9 until the next turn-off. On the other hand, the voltage, or electric charges which remain in the capacitor 8 even when the GTO 3 is turned on are blocked discharging by the diode 6. Therefore, the capacitor 8 is always charged with a voltage equivalent to or higher than the power supply voltage $V_{DD}$.

Furthermore, the peak voltage $V_P$ from time $t_4$ to $t_5$ is based on the electric energy produced by a floating inductance (or main inductance) $L_{A2}$ and the capacitance value of the capacitor 8.

Thus, as to the energy accumulated in the peak voltage suppressing circuit or the capacitor 8 of the protective circuit in the semiconductor switching apparatus 10A, only the overcharged electric charges are discharged, in contrast to the background art where the electric charges in the snubber capacitor are entirely discharged to become 0 by the snubber resistor, and therefore the present invention makes it possible to substantially reduce the dissipation of the snubber circuit which has been a problem in the background art. Furthermore, in the semiconductor switching apparatus 10A, the protective circuit is simply configured of the same materials as those used for the snubber circuit in the background art, specifically by connecting the wire of resistor used for the background-art snubber resistor as the interconnection path R4 of the present invention direct to the node 14 of the power supply 9. Thus, advantageously, the semiconductor switching apparatus is practically achieved with high probability since it utilizes the background-art snubber circuit to sufficiently reduce the dissipation Naturally, the semiconductor switching apparatus 10A can completely block the breakdown of the GTO 3 at the turn-off, like the semiconductor switching apparatus 10 of FIG. 1.

While the invention has been shown and described in detail, the foregoing description is in all aspects illustrative and not restrictive. It is therefore understood that numerous modifications and variations can be devised without departing from the scope of the invention.

We claim:

1. A semiconductor switching apparatus, comprising:

a semiconductor switching element having first, second and third electrodes, for carrying a main current which flows into said first electrode, from said first electrode direct to said second electrode when brought into an on-state in response to a turn-on control current applied to said third electrode; and driving control means connected between said third and second electrodes, for producing said turn-on control current and applying it to said third electrode, wherein said main current is entirely commutated to said driving control means through the first to third electrodes in a direction reverse to said turn-on control current at a turn-off.

2. The semiconductor switching apparatus of claim 1, further comprising:

peak voltage suppressing means for holding a voltage between said first and second electrodes to a prescribed voltage value for a prescribed period when said voltage between said first and second electrodes rises and reaches to said prescribed voltage value at said turn-off, wherein said prescribed voltage value is determined within a limit beyond which said voltage between said first and second electrodes exceeds a voltage blocking capability of said semiconductor switching element.

3. The semiconductor switching apparatus of claim 2, wherein said peak voltage suppressing moans is a voltage clamp circuit connected in parallel between the first and second electrodes.

4. The semiconductor switching apparatus of claim 1, further comprising:

a power supply for driving said semiconductor switching apparatus; and a bypass line disposed in parallel between said first and second electrodes, wherein said bypass includes a capacitive element charged with a main power supply voltage of said power supply at all times.

5. The semiconductor switching apparatus of claim 4, wherein said capacitive element has one end connected direct to said power supply through a resistive of element, and said bypass line further includes a diode having an anode connected to said first electrode and a cathode connected to said one end of said capacitive element.

6. The semiconductor switching apparatus of claim 5, wherein said capacitive element has a capacitance value determined within a limit beyond which a peak voltage between said first and second electrodes developed at said turn-off exceeds said voltage blocking capability of said semiconductor switching element.

7. The semiconductor switching apparatus of claim 1, wherein said main current is commutated by controlling an inductance existing in a path from said third electrode through said driving control means and said second electrode to said third electrode.

8. A semiconductor switching apparatus comprising:

a semiconductor switching element having first second and third electrodes for carrying a main current which flows into said first electrode, from said first electrode direct to said second electrode when brought into an on-state in response to a turn-on control current applied to said third electrode; and driving control means connected between said third and second electrodes, for producing said turn-on control current and applying it to said third electrode[.]

wherein said main current is entirely commutated to said driving control means through the first to third electrodes in a direction reverse to said turn-on control current at a turn-off, and wherein a turn-off gain is determined [not more than] *as* 1 at said turn-off, said turn-off gain being represented by the absolute value of the ratio of said main current to a current which flows in said direction reverse to said turn-on control current.

9. The semiconductor switching apparatus of claim 8, wherein an inductance existing in a path from said third electrode through said driving control means and said second electrode to said third electrode is determined a value required to obtain said turn-off gain of [not more than] 1.

10. A semiconductor switching apparatus, comprising:

a semiconductor switching element; and an interconnection path for transmitting a turn-on control current necessary to turn said semiconductor switching element on to flow into said semiconductor switching element, wherein said interconnection path is disposed so that a main current flowing into said semiconductor switching element in an on-state is entirely commutated to said interconnection path at a turn-off.

11. A method of controlling a semiconductor switching element having first, second and third electrodes, comprising steps of:

providing a driving circuit for generating a turn-on control current for turning on said semiconductor switching element;

applying said turn-on control current to said third electrode to bring said semiconductor switching element into an on-state; and commutating a main current flowing into said first electrode entirely towards said second electrode through said driving circuit in a direction reverse to said turn-on control current to turn said semiconductor switching element off.

12. The method of claim 11, wherein said semiconductor switching element is turned off with a turn-off gain which is controlled to be [not more than] 1, said turn-off gain being represented by the absolute value of the ratio of said main current to a current flowing in said direction reverse to said turn-on control current.

13. The method of claim 12, further comprising a step of:

clamping a voltage between said first and second electrodes rising on at a turn-off state to a prescribed voltage value after said semiconductor switching element is brought into said turn-off state, said prescribed voltage value being determined within a limit beyond which said voltage between said first and second electrodes exceeds a voltage blocking capability of said semiconductor switching element.

14. The method of claim 12, wherein said step of providing said driving circuit further comprises a step of providing a capacitive element between said first and second elements, said capacitive element being charged with a power supply voltage of a power supply for driving a semiconductor switching apparatus using said semiconductor switching element at all times, and said method further comprises a step of:

bypass-discharging electric charges charged in said capacitive element to a loop including said power supply and said capacitive element in response to a spike voltage and a peak voltage developed with a rise of voltage between said first and second electrodes, after said semiconductor switching element is brought into a turn-off state.

*15. The semiconductor switching apparatus of claim 1, wherein*

*no current flows directly between said second electrode and said third electrode during said turn-off during which said main current decreases toward a zero level.*

*16. The semiconductor switching apparatus of claim 8, wherein*

*no current flows directly between said second electrode and said third electrode during said turn-off during which said main current decreases toward a zero level.*

*17. The semiconductor switching apparatus of claim 10, wherein*

*no current flows directly between said second electrode and said third electrode during said turn-off during which said main current decreases toward a zero level.*

*18. The method of claim 11, wherein*

*no current flows directly between said second electrode and said third electrode during said turn-off during which said main current decreases toward a zero level.*

* * * * *